US011561853B2

(12) United States Patent
Ock et al.

(10) Patent No.: US 11,561,853 B2
(45) Date of Patent: Jan. 24, 2023

(54) MEMORY SYSTEM AND MEMORY CONTROLLER DETERMINING A MAGNITUDE OF A POWER SUPPLIED TO THE MEMORY CONTROLLER WHEN ERROR HAS OCCURRED IN TARGET DATA

(71) Applicant: SK hynix Inc., Icheon-si (KR)

(72) Inventors: Eun Jae Ock, Seongnam-si (KR); Sung Jin Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 233 days.

(21) Appl. No.: 16/892,073

(22) Filed: Jun. 3, 2020

(65) Prior Publication Data

US 2021/0133021 A1    May 6, 2021

(30) Foreign Application Priority Data

Nov. 5, 2019 (KR) .................. 10-2019-0140001

(51) Int. Cl.
*G06F 11/07* (2006.01)
*G06F 11/10* (2006.01)
*G06F 1/28* (2006.01)

(52) U.S. Cl.
CPC ............ *G06F 11/1004* (2013.01); *G06F 1/28* (2013.01); *G06F 11/0793* (2013.01); *G06F 11/0796* (2013.01); *G06F 11/1072* (2013.01)

(58) Field of Classification Search
CPC ............. G06F 11/1004; G06F 11/0793; G06F 11/0796; G06F 11/1048; G06F 3/0619; G06F 3/0629; G06F 1/3206; G06F 1/3225; G06F 1/3234; G06F 1/3275; G06F 1/3296; G11C 2211/561; G11C 16/26; G11C 16/285621; G11C 16/34; G11C 16/3404; G11C 16/3436; G11C 16/3454; G11C 16/3459; G11C 16/3463; G11C 16/00;

(Continued)

(56) References Cited

U.S. PATENT DOCUMENTS 4,507,730 A * 3/1985 Johnson ................ G06F 11/006
                                                           711/E12.086
10,761,754 B2 * 9/2020 Shen .................... G11C 13/0069

(Continued)

FOREIGN PATENT DOCUMENTS

KR    10-2012-0101273 A    9/2012
KR    10-2016-0052920 A    5/2016

OTHER PUBLICATIONS

Wikipedia's Checksum historical version published Oct. 27, 2019 https://en.wikipedia.org/w/index.php?title=Checksum&oldid=923245623 (Year: 2019).*

*Primary Examiner* — Joseph O Schell
(74) *Attorney, Agent, or Firm* — Perkins Coie LLP

(57) ABSTRACT

A memory system and a memory controller are disclosed. By determining whether an error has occurred in target data stored in a predetermined target memory area of the memory device and determining, in response to whether an error has occurred in the target data, the magnitude of the supplied power based on a first operation parameter selected among predetermined candidate operation parameters in connection with the magnitude of the supplied power, the memory controller may stably drive a firmware, and may handle an operation error of the firmware due to a change in external environment.

18 Claims, 14 Drawing Sheets

(58) Field of Classification Search
CPC ....... G11C 16/06; G11C 16/10; G11C 16/102;
G11C 16/105; G11C 16/12; G11C 16/14;
G11C 16/16; G11C 16/18; G11C 16/30;
G11C 29/06; G11C 29/08; G11C 29/52;
G11C 11/5628; G11C 11/5642; G11C
5/14; G11C 5/147; G11C 5/148; G11C
2029/5004

See application file for complete search history.

(56) References Cited

U.S. PATENT DOCUMENTS

| | | | | |
|---|---|---|---|---|
| 2007/0263441 | A1* | 11/2007 | Cornwell | G11C 16/0483 |
| | | | | 714/E11.038 |
| 2009/0150713 | A1* | 6/2009 | Mangione-Smith | ........................ |
| | | | | G06F 11/1407 |
| | | | | 713/300 |
| 2015/0255158 | A1* | 9/2015 | Fujita | G11C 16/10 |
| | | | | 365/185.12 |
| 2015/0363116 | A1* | 12/2015 | Govindan | G06F 1/3296 |
| | | | | 713/320 |
| 2016/0092306 | A1* | 3/2016 | Benedict | G06F 11/1076 |
| | | | | 714/764 |
| 2017/0357310 | A1* | 12/2017 | Hovis | G06F 1/206 |
| 2018/0018217 | A1* | 1/2018 | Cordero | G06F 11/1052 |
| 2020/0066322 | A1* | 2/2020 | Maeda | G11C 11/4074 |

* cited by examiner

TOTAL_DATA_WRITE_SIZE = (24 + 5 + 12) = 41(MB)

| | TOTAL_DATA_WRITE_SIZE |
|---|---|
| PARAM_1 | 500MB |
| PARAM_2 | 1GB |
| PARAM_3 | 2GB |
| PARAM_4 | 3GB |
| PARAM_5 | 1GB | set operation parameter of
PWR_CTRL as PARAM_4

MEMORY SYSTEM AND MEMORY CONTROLLER DETERMINING A MAGNITUDE OF A POWER SUPPLIED TO THE MEMORY CONTROLLER WHEN ERROR HAS OCCURRED IN TARGET DATA

CROSS-REFERENCE TO RELATED APPLICATION

This patent document claims the priority and benefits of Korean Patent Application No. 10-2019-0140001 filed in the Korean Intellectual Property Office on Nov. 5, 2019, which is incorporated herein by reference in its entirety.

TECHNICAL FIELD

The technology and implementations disclosed in this patent document generally relate to a memory system and a memory controller.

BACKGROUND

Storage devices refer to electronic components that are used to store data on a permanent or temporary basis. Each storage device may include one or more storage medium to store data and operate based on a request of a host. Examples of the host include a computer, a mobile terminal such as a smartphone and a tablet, or other various electronic devices. The storage device can be classified based on the type of storage medium. For example, a hard disk drive (HDD) uses a magnetic disk as the storage medium, and a solid state drive (SDD), a universal flash storage (UFS) device and an embedded MMC (eMMC) device use, as the storage medium, semiconductor devices such as a volatile memory device and a nonvolatile memory device.

A memory system may include a memory controller for controlling a memory device. The memory controller may receive a command from the host, and may perform or control an operation for reading, writing or erasing data with respect to a volatile memory or a nonvolatile memory included in the memory system, based on the received command. The memory controller may drive a firmware for performing logical calculations to execute or control these operations.

The memory controller is supplied with power from an external power source to drive the firmware through an internal processor. In certain type of memory devices, whether the memory controller stably drives the firmware may depend on a state of power supplied from the external power source.

SUMMARY

Various embodiments of the disclosed technology relate to a memory system and a memory controller capable of selecting an operation parameter of a power controller that may stably drive a firmware.

Also, various embodiments are directed to a memory system and a memory controller capable of handling an operation error of a firmware that may occur due to a change in external environment.

In one aspect, a memory system is provided to include: a memory device; and a memory controller configured to control the memory device, wherein the memory controller determines whether an error has occurred in target data stored in a target memory area set in advance, and sets, when an error has occurred in the target data, an operation parameter of a power controller which controls a magnitude of power supplied to the memory controller, to a first operation parameter as one of a plurality of candidate operation parameters set in advance.

In another aspect, a memory system is provided to include: a memory device; and a memory controller in communication with the memory device and configured to control the memory device and to control a magnitude of power supplied to the memory controller, wherein the memory controller is configured to: determine whether an error has occurred in target data stored in a predetermined target memory area of the memory device, and determine, in response to whether an error has occurred in the target data, the magnitude of the supplied power based on a first operation parameter selected among predetermined candidate operation parameters in connection with the magnitude of the supplied power.

In some implementations, the memory controller comprises a low drop-out regulator for controlling the supplied power. In some implementations, the memory controller is configured to determine that the error has occurred in the target data based on a checksum for the target data. In some implementations, the memory controller is further configured to determine whether to maintain or change the first operation parameter in controlling the supplied power based on a total data write size for the first operation parameter, and the total data write size for the operation parameter is determined as a total data size required to write data to the memory device based on a request from a host during a certain period of time. In some implementations, the certain period of time starts when the memory controller set the first operation parameter and ends at the time of the occurrence of the error in the target data or a confirmation of the error by the memory controller.

In some implementations, the memory controller is configured to change the first operation parameter to a second operation parameter based on a determination that the total data write size for the first operation parameter is smaller than a predetermined first size. In some implementations, the memory controller is further configured to determine whether to store the total data write size for the first operation parameter in a history area that is predetermined. In some implementations, the memory controller is configured to store information on the total data write size for the first operation parameter in the history area in a case that the total data write size for the first operation parameter is equal to or larger than a predetermined second size. In some implementations, the memory controller is further configured to select the second operation parameter as one whose total data write size is maximum as compared to remaining candidate operation parameters when total data write sizes for all the candidate operation parameters are smaller than the first size.

In another aspect, a memory controller suitable for controlling a power controller is provided to comprise: a control circuit configured to set an operation parameter of the power controller, wherein the power controller controls a magnitude of power supplied to the memory controller, and wherein the control circuit determines whether an error has occurred in target data stored in a target memory area set in advance, and sets, when an error has occurred in the target data, the operation parameter of the power controller to a first operation parameter as one of a plurality of candidate operation parameters set in advance.

In another aspect, a memory controller for controlling a power controller is provided to comprise: a control circuit configured to determine a first operation parameter of the power controller that is configured to control a magnitude of power supplied to the memory controller, and wherein the control circuit is further configured to: determine whether an error has occurred in target data stored in a predetermined target memory area of the memory device, and determine, in response to whether an error has occurred in the target data, the magnitude of the supplied power based on a first operation parameter selected among predetermined candidate operation parameters in connection with the magnitude of the supplied power.

In some implementations, the power controller comprises a low drop-out regulator for controlling the supplied power. In some implementations, the control circuit is further configured to determine that the error has occurred in the target data based on a checksum for the target data. In some implementations, the control circuit is further configured to determine whether to maintain or change the first operation parameter in controlling the supplied power based on a total data write size for the first operation parameter, and the total data write size for the operation parameter is determined as a total data size required to write data to the memory device based on a request from a host during a certain period of time. In some implementations, the certain period of time starts when the memory controller set the first operation parameter and ends at the time of the occurrence of the error in the target data or a confirmation of the error by the control circuit.

In some implementations, the control circuit is further configured to change the first operation parameter to a second operation parameter based on a determination that the total data write size for the first operation parameter is smaller than a predetermined first size. In some implementations, the control circuit is further configured to determine whether to store the total data write size for the first operation parameter in a history area that is predetermined. In some implementations, the control circuit is further configured to store information on the total data write size for the first operation parameter in the history area in a case that the total data write size for the first operation parameter is equal to or larger than a predetermined second size. In some implementations, the control circuit is further configured to select the second operation parameter as one whose total data write size is maximum as compared to remaining candidate operation parameters when total data write sizes for all the candidate operation parameters are smaller than the first size.

According to the embodiments of the disclosed technology, it is possible to select an operation parameter of a power controller capable of stably driving a firmware.

Also, according to the embodiments of the disclosed technology, it is possible to handle an operation error of a firmware that may occur due to a change in external environment.

DETAILED DESCRIPTION

Hereinafter, various examples of embodiments of the disclosed technology will be described in detail with reference to the accompanying drawings.

Figure 1:
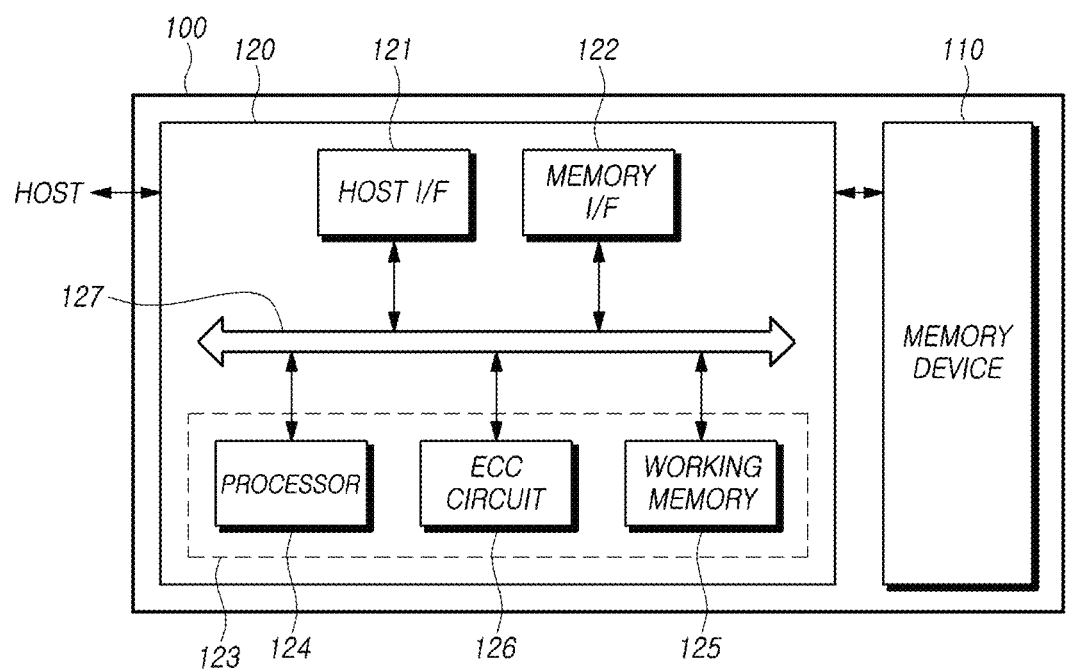
FIG. 1 is a configuration diagram schematically illustrating a representation of an example of a memory system in accordance with embodiments of the disclosed technology.

FIG. 1 is a configuration diagram schematically illustrating a representation of an example of a memory system 100 in accordance with embodiments of the disclosed technology.

Referring to FIG. 1, the memory system 100 in accordance with the embodiments of the disclosed technology may include a memory device 110 which stores data, and a memory controller 120 which controls the memory device 110.

The memory device 110 includes a plurality of memory blocks, and operates in response to the control of the memory controller 120. Operations of the memory device 110 may include, for example, a read operation, a program operation (also referred to as a write operation) and an erase operation.

The memory device 110 may include a memory cell array including a plurality of memory cells (also simply referred to as "cells"), each configured to store data. In some implementations, the memory cells can store a single bit or more bits of information. Such a memory cell array may include memory blocks. The memory cell array may include a plurality of memory blocks. Each memory block may include a plurality of pages, and each page corresponds to a plurality of memory cells. A single memory block may include a plurality of pages.

For example, the memory device 110 may be realized into various types such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM).

The memory device 110 may be realized in a three-dimensional array structure. In some implementations, the embodiments of the disclosed technology may be applied to a flash memory device in which a charge storage layer is configured by a conductive floating gate. In some other implementations, the embodiments of the disclosed technology may be applied to a charge trap flash (CTF) in which a charge storage layer is configured by a dielectric layer.

The memory controller 200 can access the memory device 110 based on requests from the user/host by providing command/address signals to the memory controller 200. In some implementations, the memory device 110 is configured to receive, from the memory controller 120, a command and an address in which the command is performed or executed, and access an area in the memory cell array which is selected by the address. For example, the memory device 110 may perform an operation corresponding to the command, for an area selected by the address.

For example, the memory device 110 may perform a program operation, a read operation or an erase operation. In the program operation, data is written to the area (e.g., memory cell area) of the memory device 110, which is identified by the address. In the read operation, data is read from the area of the memory device 100, which is identified by the address. In the erase operation, data is erased from the area of the memory device 110, which is identified by the address.

The memory controller 120 may control write (program), read, erase, or background operations for the memory device 110. For example, the background operation may include at least one among a garbage collection (GC) operation, a wear leveling (WL) operation, a bad block management (BBM) operation, and so forth. The term "garbage collection" as used herein may refer to a form of memory management, in which a garbage collector attempts to reclaim (garbage) memory that is occupied by objects that are no longer in use. The wear leveling indicates techniques for prolonging lifetime of erasable storage devices.

The memory controller 120 may control the operation of the memory device 110 according to a request of a host. Unlike this, the memory controller 120 may control the operation of the memory device 110 regardless of a request of the host.

In some implementations, the memory controller 120 and the host may be devices which are separated from each other. In some implementations, the memory controller 120 and the host may be integrated into one device. In the below, for the sake of convenience in explanation, it will be described as an example that the memory controller 120 and the host are devices which are separated from each other.

Referring to FIG. 1, the memory controller 120 may include a memory interface 122 and a control circuit 123, and may further include a host interface 121.

The host interface 121 provides an interface for communication with the host.

When receiving a command from the host, the control circuit 123 may receive the command through the host interface 121, and then, may perform an operation of processing the received command.

The memory interface 122 is coupled with the memory device 110 and thereby provides an interface for communication with the memory device 110. That is to say, the memory interface 122 may be configured to provide the interface between the memory device 110 and the memory controller 120 in response to the control of the control circuit 123.

The control circuit 123 performs the general control operations of the memory controller 120, thereby controlling the operations of the memory device 110. To this end, for instance, the control circuit 123 may include at least one of a processor 124 and a working memory 125, and as the case may be, may further include an error detection and correction circuit (ECC circuit) 126.

The processor 124 may control general operations of the memory controller 120, and may perform a logic calculation. The processor 124 may communicate with the host through the host interface 121, and may communicate with the memory device 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the received logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 is configured to randomize data received from the host. For example, the processor 124 may randomize data received from the host, by using a randomizing seed. Randomized data as data to be stored is provided to the memory device 110 and is programmed to the memory cell array.

The processor 124 is configured to derandomize data received from the memory device 110, in a read operation. For example, the processor 124 may derandomize data received from the memory device 110, by using a derandomizing seed. Derandomized data may be outputted to the host.

The processor 124 may control the operation of the memory controller 120 by executing a firmware. In other words, in order to control general operations of the memory controller 120 and perform a logic calculation, the processor 124 may execute (drive) a firmware loaded to the working memory 125 upon booting.

The firmware as a program to be executed in the memory system 100 may include various functional layers.

For example, the firmware may include at least one among a flash translation layer (FTL) which performs a translating function between a logical address requested to the memory system 100 from the host and a physical address of the memory device 110, a host interface layer (HIL) which serves to analyze a command requested to the memory system 100 as a storage device from the host and transfer the command to the flash translation layer (FTL), a flash interface layer (FIL) which transfers a command instructed from the flash translation layer (FTL) to the memory device 110, and so forth.

For instance, such a firmware may be stored in the memory device 110 and then be loaded to the working memory 125.

The working memory 125 may store a firmware, a program code, a command and data which are necessary to drive the memory controller 120. The working memory 125, for example, as a volatile memory, may include at least one among an SRAM (static RAM), a DRAM (dynamic RAM) and an SDRAM (synchronous DRAM).

The error detection and correction circuit 126 may be configured to detect an error bit of checking target data and correct the detected error bit, by using an error correction code. Here, the checking target data may be, for example, data stored in the working memory 125, data read from the memory device 110, or the like.

The error detection and correction circuit 126 may be realized to decode data by using an error correction code. The error detection and correction circuit 126 may be realized by various code decoders. For example, a decoder which performs unsystematic code decoding or a decoder which performs systematic code decoding may be used.

For example, the error detection and correction circuit 126 may detect an error bit for each read data, in the unit of sector. Namely, each read data may be constituted by a plurality of sectors. A sector may mean a data unit smaller than a page as a read unit of a flash memory. Sectors constituting each read data may be matched with one another by the medium of an address.

The error detection and correction circuit 126 may calculate a bit error rate (BER), and may determine whether an error is correctable or not, in the unit of sector. For example, in the case where a bit error rate (BER) is higher than a reference value, the error detection and correction circuit 126 may determine that a corresponding sector is uncorrectable or a fail. On the other hand, in the case where a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, the error detection and correction circuit 126 may detect a sector which is determined to be uncorrectable to the last. There may be one or more sectors that are determined to be uncorrectable. The error detection and correction circuit 126 may transfer information (for example, address information) on a sector which is determined to be uncorrectable, to the processor 124.

A bus 127 may be configured to provide channels among the components 121, 122, 124, 125 and 126 of the memory controller 120. The bus 127 may include, for example, a control bus for transferring various control signals, commands and the likes, a data bus for transferring various data, and so forth.

The above-described components 121, 122, 124, 125 and 126 of the memory controller 120 are for an illustration purpose only. Some of the above-described components 121, 122, 124, 125 and 126 of the memory controller 120 may be omitted, or some of the above-described components 121, 122, 124, 125 and 126 of the memory controller 120 may be integrated into one. As the case may be, in addition to the above-described components 121, 122, 124, 125 and 126 of the memory controller 120, one or more other components may be added.

Hereinbelow, the memory device 110 will be described in further detail with reference to FIG. 2.

Figure 2:
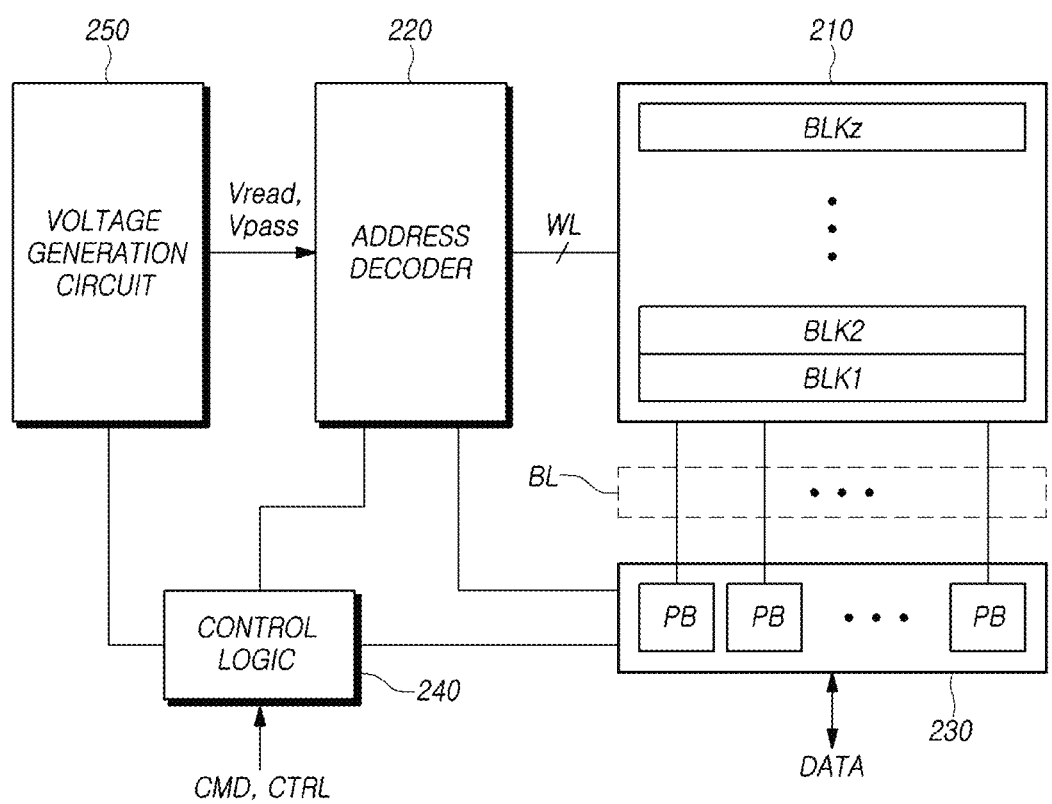
FIG. 2 is a block diagram schematically illustrating a representation of an example of a memory device in accordance with embodiments of the disclosed technology.

FIG. 2 is a block diagram schematically illustrating a representation of an example of the memory device 110 in accordance with the embodiments of the disclosed technology.

Referring to FIG. 2, the memory device 110 in accordance with the embodiments may include a memory cell array 210, an address decoder 220, a read and write circuit 230, a control logic 240, and a voltage generation circuit 250.

The memory cell array 210 may include a plurality of memory blocks BLK1 to BLKz (z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured with nonvolatile memory cells which have vertical channel structures.

The memory cell array 210 may include a memory cell array having a two-dimensional structure, or a memory cell array having a three-dimensional structure.

Each of the plurality of memory cells included in the memory cell array 210 may store at least 1-bit data. For instance, each of the plurality of memory cells included in the memory cell array 210 may be a signal level cell (SLC) which stores 1-bit data. For another instance, each of the plurality of memory cells included in the memory cell array 210 may be a multi-level cell (MLC) which stores 2-bit data. For still another instance, each of the plurality of memory cells included in the memory cell array 210 may be a triple level cell (TLC) which stores 3-bit data. For yet another instance, each of the plurality of memory cells included in the memory cell array 210 may be a quad level cell (QLC) which stores 4-bit data. For still yet another instance, the memory cell array 210 may include a plurality of memory cells, each of which stores 5 or more-bit data.

Referring to FIG. 2, the address decoder 220, the read and writhe circuit 230, the control logic 240 and the voltage generation circuit 250 may operate as peripheral circuits which drive the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory device 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block in a read voltage applying operation during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory device 110 may be performed in the unit of page. An address received when a read operation or a program operation is requested may include at least one among a block address, a row address and a column address.

The address decoder 220 may select one memory block and one word line depending on a block address and a row address. A column address may be decoded by the address decoder 220 and be provided to the read and write circuit 230.

The address decoder 220 may include at least one among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit which includes a plurality of page buffers PB. The read and write circuit 230 may include data buffers which take charge of a data processing function. In some implementations, the read and write circuit 230 may further include cache buffers which take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, that the amounts of current flowing depending on the programmed states of the corresponding memory cells are changed.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory device 110. As an exemplary embodiment, the read and write circuit 230 may include a column select circuit and so forth in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory device 110.

The control logic 240 may be configured to control general operations of the memory device 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Figure 3:
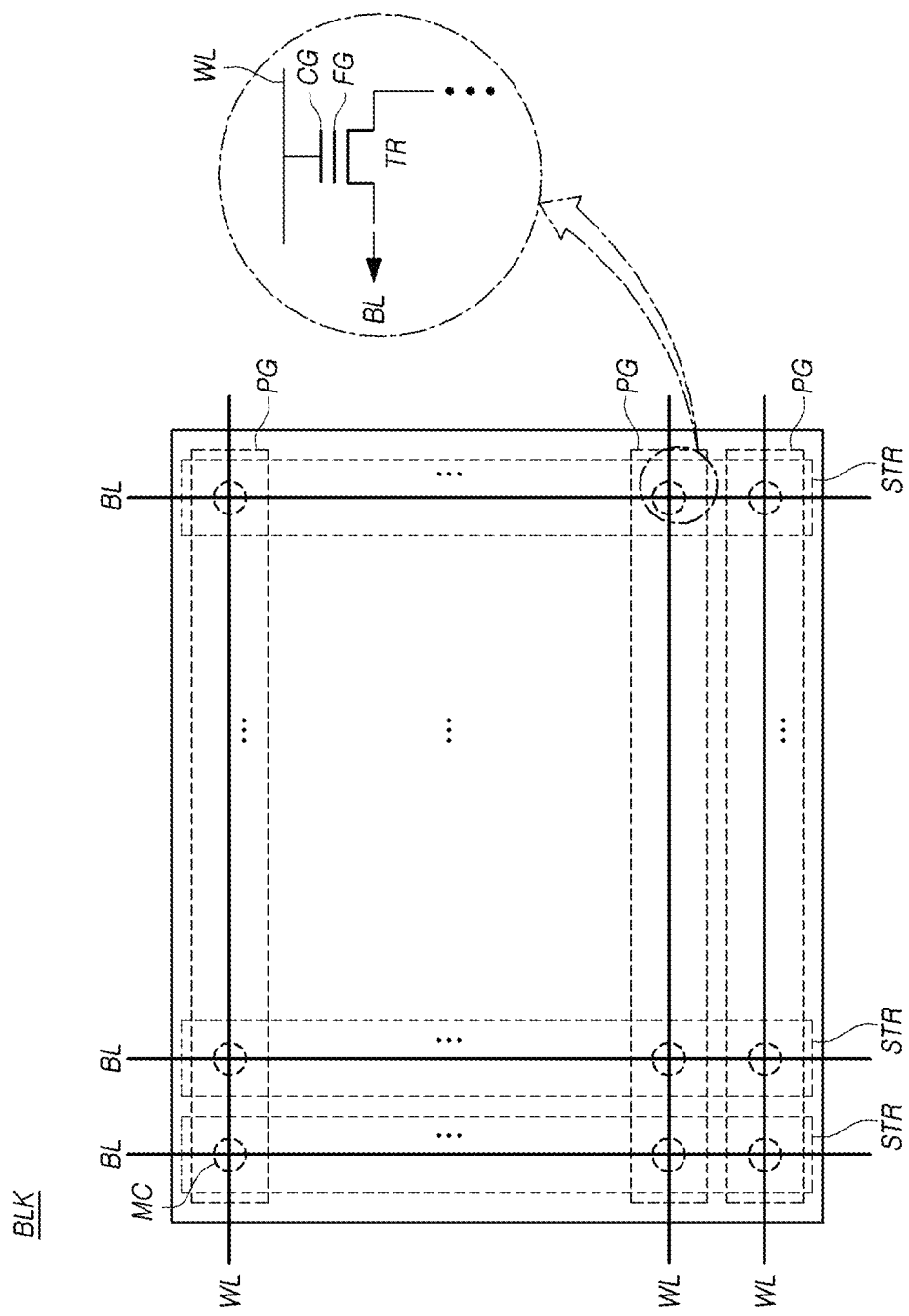
FIG. 3 is a diagram schematically illustrating a representation of an example of each memory block of a memory device in accordance with embodiments of the disclosed technology.

FIG. 3 is a diagram schematically illustrating a representation of an example of each memory block BLK of the memory device 110 in accordance with the embodiments of the disclosed technology.

Referring to FIG. 3, the memory block BLK included in the memory device 110 may be configured, for example, as a plurality of pages PG and a plurality of strings STR are disposed in directions intersecting with each other.

The plurality of pages PG correspond to a plurality of word lines WL, and the plurality of strings STR correspond to a plurality of bit lines BL.

In the memory block BLK, the plurality of word lines WL and the plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

As the plurality of word lines WL and the plurality of bit lines BL intersect with each other, a plurality of memory cells MC may be defined. A transistor TR may be disposed in each memory cell MC.

For example, the transistor TR disposed in each memory cell MC may include a drain, a source and a gate. The drain (or source) of the transistor TR may be coupled with a corresponding bit line BL directly or via another transistor TR. The source (or drain) of the transistor TR may be coupled with a source line (which may be the ground) directly or via another transistor TR. The gate of the transistor TR may include a floating gate FG which is surrounded by a dielectric and a control gate CG to which a gate voltage is applied from a word line WL.

In each of the plurality of memory blocks BLK1 to BLKz, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

In some implementations, at least one dummy word line may be additionally disposed between the first outermost word line and the first select line. At least one dummy word line may also be additionally disposed between the second outermost word line and the second select line. The dummy word lines may refer to word lines that are used for purposes other than applying a signal to a corresponding memory cell.

When the memory device 110 has a memory block structure illustrated in FIG. 3, a read operation and a program operation (write operation) may be performed on a page basis, and an erase operation may be performed on a memory block basis.

Figure 4:
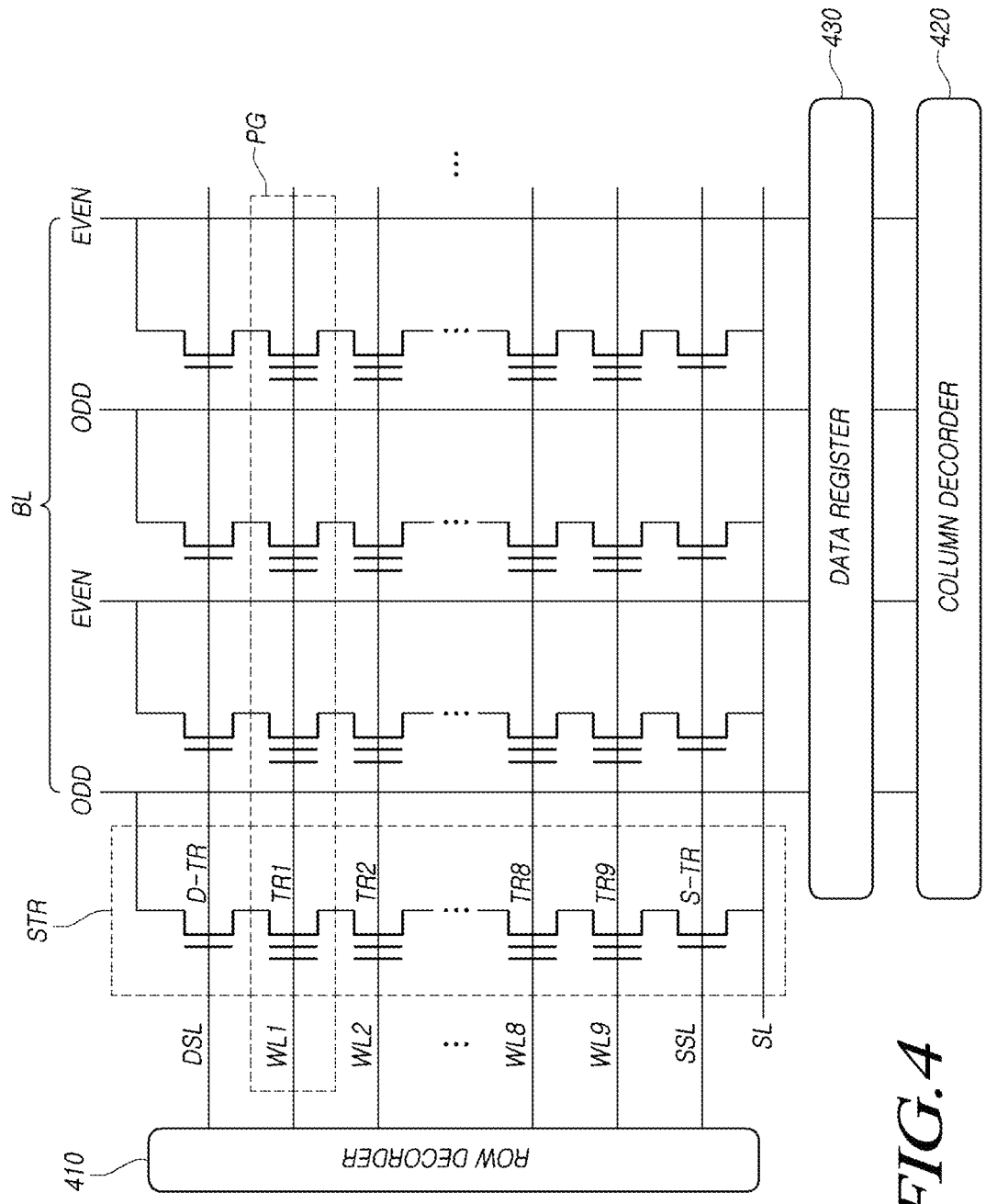
FIG. 4 is a diagram illustrating a representation of an example of a structure of word lines and bit lines of a memory device in accordance with embodiments of the disclosed technology.

FIG. 4 is a diagram illustrating a representation of an example of a structure of word lines WL and bit lines BL of the memory device 110 in accordance with the embodiments of the disclosed technology.

Referring to FIG. 4, in the memory device 110, there exist a core area in which memory cells MC are gathered and an auxiliary area which corresponds to the remaining area except the core area and supports the operation of the memory cell array 210.

The core area may be configured by pages PG and strings STR. In such a core area, a plurality of word lines WL1 to WL9 and a plurality of bit lines BL are disposed to intersect with each other.

The plurality of word lines WL1 to WL9 may be coupled with a row decoder 410, and the plurality of bit lines BL may be coupled with a column decoder 420. A data register 430 corresponding to the read and write circuit 230 may exist between the plurality of bit lines BL and the column decoder 420.

The plurality of word lines WL1 to WL9 correspond to a plurality of pages PG.

For example, as illustrated in FIG. 4, each of the plurality of word lines WL1 to WL9 may correspond to one page PG. Unlike this, in the case where the size of each of the plurality of word lines WL1 to WL9 is large, each of the plurality of word lines WL1 to WL9 may correspond to at least two (for example, two or four) pages PG. Page PG is a minimum unit in performing a program operation and a read operation. In the program operation and the read operation, all memory cells MC in the same page PG may simultaneously perform the corresponding operations.

The plurality of bit lines BL may be coupled with the column decoder 420 while being identified as odd-numbered bit lines BL and even-numbered bit lines BL.

In order to access memory cells MC, first, an address may be entered into the core area through the row decoder 410 and the column decoder 420 via an input/output terminal, and may designate target memory cells. Designating target memory cells means accessing memory cells MC positioned at sites where the word lines WL1 to WL9 coupled with the row decoder 410 and the bit lines BL coupled with the column decoder 420 intersect with each other, to program data to the memory cells MC or read out programmed data from the memory cells MC.

A page PG in a first direction (e.g., an X-axis direction) is bound (coupled) by a common line which is referred to as a word line WL, and a string STR in a second direction (e.g., a Y-axis direction) is bound (coupled) by a common line which is referred to as a bit line BL. Being bound in common means that corresponding memory cells MC are structurally coupled with one another by the same material and the same voltage is simultaneously applied to the memory cells MC when a voltage is applied thereto. Of course, as a memory cell MC which is coupled in series and is positioned at an intermediate position or a last position is influenced by a voltage drop in a preceding memory cell MC, voltages applied to a first memory cell MC and a last memory cell MC may be slightly different from each other.

Since data is programmed and read via the data register 430 in all data processing operations of the memory device 110, the data register 430 plays a key role. If data processing of the data register 430 is delayed, all the other areas need to wait until the data register 430 completes the data processing. Also, if the performance of the data register 430 is degraded, the overall performance of the memory device 110 may be degraded.

Referring to the illustration of FIG. 4, in one string STR, a plurality of transistors TR1 to TR9 which are coupled with the plurality of word lines WL1 to WL9 may exist. Areas where the plurality of transistors TR1 to TR9 exist correspond to memory cells MC. The plurality of transistors TR1 to TR9 are transistors each of which includes a control gate CG and a floating gate FG as described above.

The plurality of word lines WL1 to WL9 include two outermost word lines WL1 and WL9. A first select line DSL may be additionally disposed outside a first outermost word line WL1 which is more adjacent to the data register 430 in terms of signal path between the two outermost word lines WL1 and WL9, and a second select line SSL may be additionally disposed outside a second outermost word line WL9 between the two outermost word lines WL1 and WL9.

A first select transistor D-TR which is on-off controlled by the first select line DSL is a transistor which has only a gate electrode coupled with the first select line DSL and does not include a floating gate FG. A second select transistor S-TR which is on-off controlled by the second select line SSL is a transistor which has only a gate electrode coupled with the second select line SSL and does not include a floating gate FG.

The first select transistor D-TR serves as a switch which turns on or off the coupling between a corresponding string STR and the data register 430. The second select transistor S-TR serves as a switch which turns on or off the coupling between the corresponding string STR and a source line SL. That is to say, the first select transistor D-TR and the second select transistor S-TR are positioned at both ends of the corresponding string STR, and serve as gatekeepers which couple and decouple signals.

In a program operation, because it is necessary to fill electrons in a target memory cell MC of a bit line BL which is to be programmed, the memory system 100 turns on the first select transistor D-TR by applying a predetermined turn-on voltage Vcc to the gate electrode of the first select transistor D-TR, and turns off the second select transistor S-TR by applying a predetermined turn-off voltage (e.g., 0V) to the gate electrode of the second select transistor S-TR.

In a read operation or a verify operation, the memory system 100 turns on both the first select transistor D-TR and the second select transistor S-TR. Accordingly, since current may be discharged to the source line SL corresponding to the ground through the corresponding string STR, a voltage level of the bit line BL may be measured. However, in the read operation, there may be a time difference between on-off timings of the first select transistor D-TR and the second select transistor S-TR.

In an erase operation, the memory system 100 may supply a predetermined voltage (e.g., +20V) to a substrate through the source line SL. In the erase operation, the memory system 100 floats both the first select transistor D-TR and the second select transistor S-TR, thereby providing infinite resistance. Accordingly, the memory system 100 is structured such that the first select transistor D-TR and the second select transistor S-TR do not function and electrons may operate due to a potential difference only between a floating gate FG and the substrate.

Figure 5:
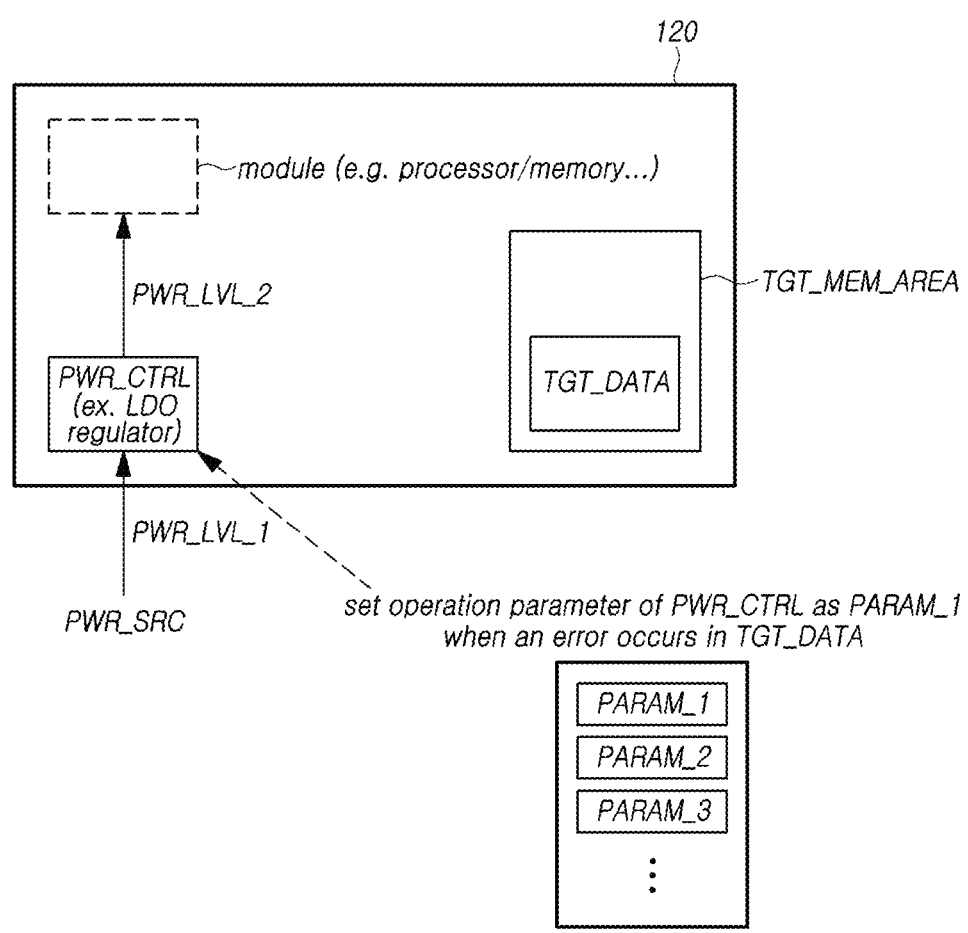
FIG. 5 is a diagram schematically illustrating a representation of an example of an operation of a memory system in accordance with embodiments of the disclosed technology.

FIG. 5 is a diagram schematically illustrating a representation of an example of an operation of the memory system 100 in accordance with the embodiments of the disclosed technology.

Referring to FIG. 5, the memory controller 120 included in the memory system 100 may determine whether an error has occurred in target data TGT_DATA stored in a target memory area TGT_MEM_AREA set in advance.

The target memory area TGT_MEM_AREA may be positioned in the working memory 125 inside the memory controller 120.

For example, the target data TGT_DATA stored in the target memory area TGT_MEM_AREA may be a part of a firmware loaded from the memory device 110. In another example, the target data TGT_DATA may be a part of data read from the memory device 110 or data to be written to the memory device 110 based on a request form the host.

The memory controller 120 may determine whether an error has occurred in the target data TGT_DATA as follows.

For example, the memory controller 120 may determine that an error has occurred in the target data TGT_DATA, in the case where a flip occurs in at least a portion of the target data TGT_DATA. The flip means that a data bit value is changed from 1 to 0 or from 0 to 1.

If a flip occurs in at least one of the bits of the target data TGT_DATA and a data bit value is changed from 1 to 0 or from 0 to 1, the memory controller 120 may determine that an error has occurred in the target data TGT_DATA, since the target data TGT_DATA has changed unexpectedly.

As another example, the memory controller 120 may determine that an error has occurred in the target data TGT_DATA, in the case where an error occurs in a checksum for the target data TGT_DATA.

If a checksum calculated after the target data TGT_DATA is generated and a currently calculated checksum of the target data TGT_DATA are different from each other, the memory controller 120 may determine that an error has occurred in the target data TGT_DATA, since the target data TGT_DATA has changed unexpectedly.

When an error has occurred in the target data TGT_DATA as described above, the memory controller 120 may set the operation parameter of a power controller PWR_CTRL which controls the magnitude of power supplied to the memory controller 120, to a first operation parameter PARAM_1 as one of a plurality of candidate operation parameters PARAM_1, PARAM_2, PARAM_3, . . . that are set in advance. The candidate operation parameters may be stored in the memory controller 120 or the memory device 110.

In some implementations, the power controller PWR_CTRL may be positioned inside the memory controller 120 as shown in FIG. 5. In other implementations, the power controller PWR_CTRL may be positioned outside the memory controller 120 in the form of a separate module or circuit.

The power controller PWR_CTRL may change the magnitude of power supplied from a power source PWR_SRC positioned outside the memory controller 120, from a first power level PWR_LVL_1 to a second power level PWR_LVL_2. The magnitude of the second power level PWR_LVL_2 may be changed depending on a value of the operation parameter of the power controller PWR_CTRL.

For example, the power controller PWR_CTRL may change the magnitude of the power supplied from the power source PWR_SRC. For example, the original magnitude of the power supplied from the power source PWR_SRC, before the change has been made by the power controller PWR_CTRL, is in a range from 1.2 to 1.4V and the magnitude of the power after the change has been made by the power controller PWR_CTRL is in a range from 1.1 to 1.15V. In some implementations, the power controller PWR_CTRL may simultaneously reduce noise while changing the magnitude of the power supplied from the power source PWR_SRC.

Therefore, even in the case where the magnitude of the power supplied from the power source PWR_SRC is substantially changed, the power controller PWR_CTRL may cause the level of the power supplied to modules/circuits (e.g., a processor and a working memory) included inside the memory controller 120, to be stably maintained.

The power controller PWR_CTRL may determine the magnitude of the second power level PWR_LVL2 relative to the first power level PWR_LVL_1 depending on the operation parameter.

For example, assuming that the magnitude of the power supplied from the power source PWR_SRC is in the range from 1.2 to 1.4V, the power controller PWR_CTRL may change the magnitude of the second power level PWR_LVL_2 to 1.1V when the operation parameter has a first value, and may change the magnitude of the second power level PWR_LVL_2 to 1.15V when the operation parameter has a second value. The value of the operation parameter can be selected among candidate operation parameters that are predetermined. The memory controller 120 may select one of the candidate operation parameters and the power controller PWR_CTRL changes the magnitude of the power based on the selected operation parameter from that supplied from the power source PWR_SRC.

If an error occurs in the target data TGT_DATA stored in the target memory area TGT_MEM_AREA, the memory controller 120 may determine that the error has occurred in the target data TGT_DATA. In the suggested implementations, the memory controller 120 considers an unstable power supply to the memory controller 120 as a cause of the occurrence of the error in the target data TGT_DATA and operates to control the power to be supplied to the memory controller.

In some implementations, when the error has occurred in the target data TGT_DATA, the memory controller 120 selects the operation parameter of the power controller PWR_CTRL to make the magnitude of power to be supplied to the memory controller 120 change accordingly. With the change of the power supplied to the memory controller 120, the memory controller 120 can operate in more stabilized manner, which includes driving a firmware more stably.

In the case where an operation error occurs in the firmware since supplied power becomes unstable due to a change (e.g., a power-down or external noise) in external environment, the memory controller 120 may handle the operation error by a method of stabilizing the power supplied to the memory controller 120 through changing the operation parameter of the power controller PWR_CTRL or selecting a new operation parameter of the power controller PWR_CTRL.

Meanwhile, the aforementioned power controller PWR_CTRL may be realized in various ways.

For example, the power controller PWR_CTRL may be implemented as a switching regulator which drops an input voltage to a preset output voltage by using an inductor.

In another example, the power controller PWR_CTRL may be a low drop-out (LDO) regulator. The LDO regulator may control an output voltage such that the difference between an input voltage and the output voltage is lower than a predetermined reference value (e.g., 1V).

Hereinafter, the LDO regulator will be described in detail.

Figure 6:
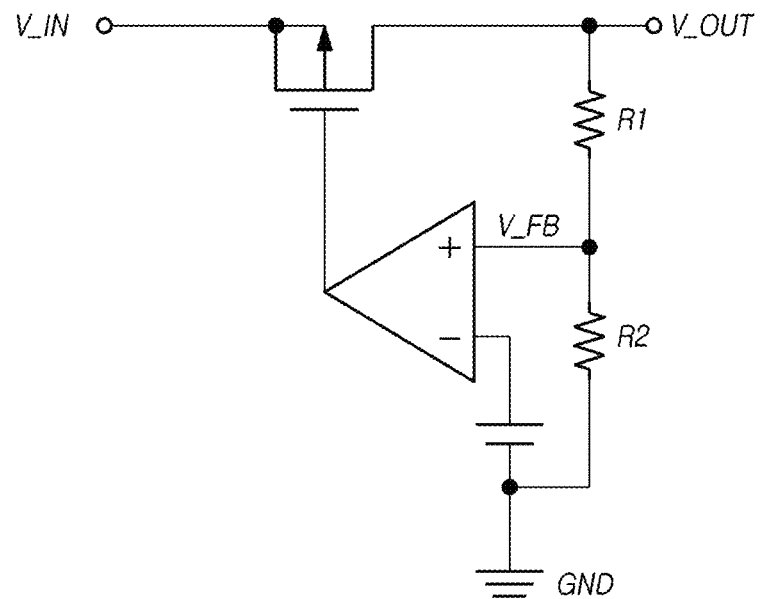
FIG. 6 is a diagram illustrating a representation of an example of a low drop out (LDO) regulator.

FIG. 6 is a diagram illustrating a representation of an example of the LDO regulator.

Referring to FIG. 6, the LDO regulator receives an input voltage signal from an input voltage pin V_IN. The input voltage signal is inputted to the source of a transistor (e.g., a PMOS transistor). The gate of the transistor is coupled with an amplifier. The drain of the transistor is coupled with an output voltage pin V_OUT. An output voltage is outputted through the output voltage pin V_OUT.

A feedback voltage V_FB which is inputted to the positive terminal of the amplifier is determined depending on the output voltage and the ratio of a first resistor R1 and a second resistor R2. The negative terminal of the amplifier is coupled with a ground GND through a capacitor, and a reference voltage is inputted to the negative terminal of the amplifier.

The LDO regulator turns on the transistor in the case where the output voltage is higher than the reference voltage, so that a voltage drop occurs, and turns off the transistor at a time point when the output voltage becomes lower than the reference voltage, so that the output voltage is maintained as it is.

Figure 7:
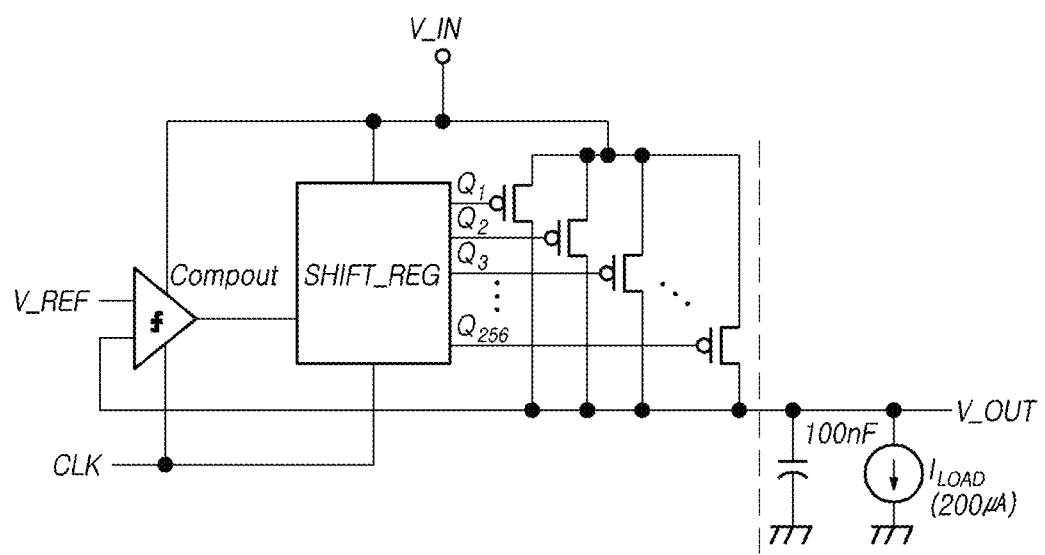
FIG. 7 is a diagram illustrating a representation of another example of a low drop out (LDO) regulator.

FIG. 7 is a diagram illustrating a representation of another example of the LDO regulator.

Referring to FIG. 7, similarly to FIG. 6, the LDO regulator converts the voltage of an input voltage signal received from an input voltage pin V_IN, and outputs an output voltage to an output voltage pin V_OUT. The output voltage outputted to the output voltage pin V_OUT is determined by a reference voltage inputted from a reference voltage pin V_REF.

Unlike FIG. 6, the LDO regulator of FIG. 7 determines whether to turn on or off each of a plurality of transistors (e.g., PMOS transistors), by using a shift register SHIFT_REG instead of an amplifier. Values outputted from the shift register SHIFT_REG may be changed depending on a clock CLK to be inputted. The magnitude of the output voltage outputted to the output voltage pin V_OUT is determined depending on the number of transistors that are turned on among the plurality of transistors.

Hereinafter, a detailed operation for the memory controller 120 to set the operation parameter of the power controller PWR_CTRL as one of candidate operation parameters will be described.

Figure 8:
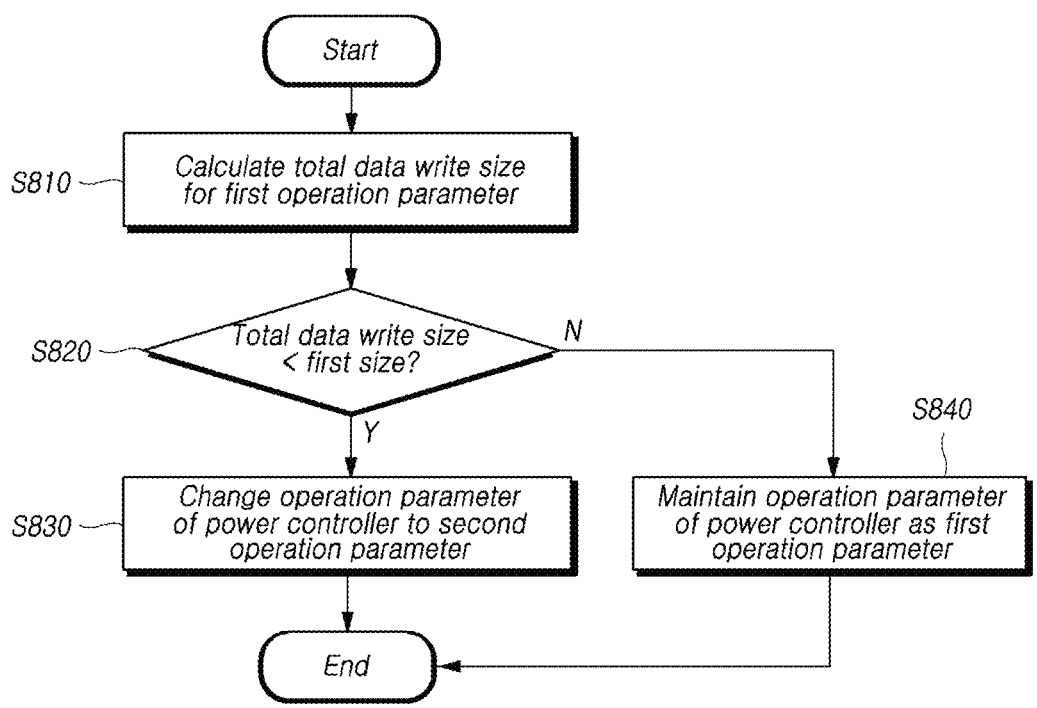
FIG. 8 is a flow chart illustrating a representation of an example of an operation of determining an operation parameter of a power controller in a memory system in accordance with embodiments of the disclosed technology.

FIG. 8 is a flow chart illustrating a representation of an example of an operation of determining the operation parameter of the power controller PWR_CTRL in the memory system 100 in accordance with the embodiments of the disclosed technology.

Hereinafter, it is assumed that the operation parameter of the power controller PWR_CTRL is determined by the memory controller 120 included in the memory system 100. Further, it is assumed that a first operation parameter among a plurality of candidate operation parameters is currently set as the current operation parameter of the power controller PWR_CTRL.

The memory controller 120 may calculate a total data write size for the first operation parameter (S810).

The total data write size for the first operation parameter means a size corresponding to a total sum of data to be rewritten by the memory controller based on a request from the host from a first time point to a second time point.

The first time point and the second time point may be determined in various ways.

For example, the first time point may be a time point at which the first operation parameter was set by the memory controller 120 as the current operation parameter of the power controller PWR_CTRL.

For example, the second time point may be a time point at which the error has occurred in target data. In some implementations, the second time point may be a time point at which the memory controller 120 confirms that the error was occurred in target data. Some delay can may exist between the actual occurrence of the error in the target data and the confirmation of the error by the memory controller 120.

As another example, the second time point may be a time point at which a data write size requested from the host becomes equal to or greater than a specific value after the first time point.

An operation of calculating a total data write size will be described below in detail with reference to FIG. 9 later.

At step S820, the memory controller 120 determines whether the total data write size for the first operation parameter, which was calculated at the step S810, is smaller than a first size that was set in advance. The value of the first size may be stored in the memory controller 120 or the memory device 110.

If the total data write size for the first operation parameter is smaller than the first size, the process proceeds to the step S830 in which the memory controller 120 may change the operation parameter of the power controller PWR_CTRL to a second operation parameter different from the first operation parameter. Each of the first operation parameter and the second operation parameter is one of the plurality of candidate operation parameters that is set in advance.

On the other hand, if the total data write size for the first operation parameter is equal to or larger than the first size, the process proceeds to the step S840 in which the memory controller 120 may maintain the current operation parameter of the power controller PWR_CTRL, which is the first operation parameter, without any change.

The total data write size is used to determine whether to change the current operation parameter of the power controller PWR_CTRL based on following reasons.

The memory controller 120 may determine that a power level controlled by the power controller PWR_CTRL is stable, when a data write operation requested from the host is normally processed.

When the total data write size for the current operation parameter is sufficiently large (e.g., equal to or larger than the first size), it means that data requested from the host is highly likely to be normally processed. Thus, in this case, the host may determine to maintain the current operation parameter of the power controller PWR_CTRL instead of making any changes.

On the other hand, when the total data write size for the current operation parameter is not sufficiently large (e.g., smaller than the first size), it means that data requested from the host is highly unlikely to be normally processed. Thus, in this case, the host may determine to change the current operation parameter of the power controller PWR_CTRL to another one instead of maintaining the current operation parameter.

Figure 9:
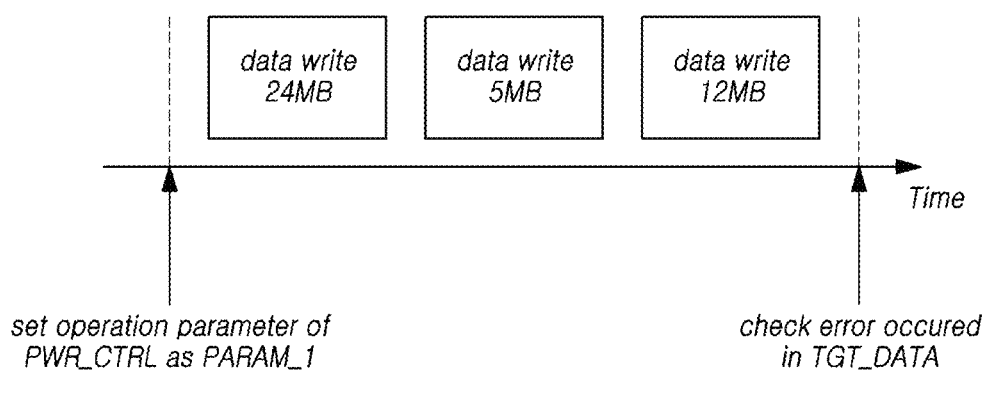
FIG. 9 is a diagram illustrating a representation of an example of an operation of calculating a total data write size in a memory system in accordance with embodiments of the disclosed technology.

FIG. 9 is a diagram illustrating a representation of an example of an operation of calculating a total data write size TOTAL_DATA_WRITE_SIZE in the memory system 100 in accordance with the embodiments of the disclosed technology.

Referring to FIG. 9, it is assumed that the memory controller 120 receives three commands from the host from a time point at which the first operation parameter PARAM_1 was set as the current operation parameter of the power controller PWR_CTRL to a time point at which an error in the target data TGT_DATA is confirmed.

It is assumed that the three commands received from the host require the memory controller 120 to write data of 24 MB, 5 MB and 12 MB, respectively, to the memory device 110.

In this case, a total data write size is determined as as 41 MB that is the sum of 24 MB, 5 MB and 12 MB.

When the operation parameter of the power controller PWR_CTRL is changed based on the comparison between the total data write size and the first size (see the step S820 in FIG. 8), the memory controller 120 may store history information indicating how the operation parameter of the power controller PWR_CTRL has been changed. Thus, the history information includes the original operation parameter of the power controller PWR_CTRL before the change. The memory controller 120 may determine a most stable operation parameter among candidate operation parameters based on the history information on operation parameters.

Figure 10:
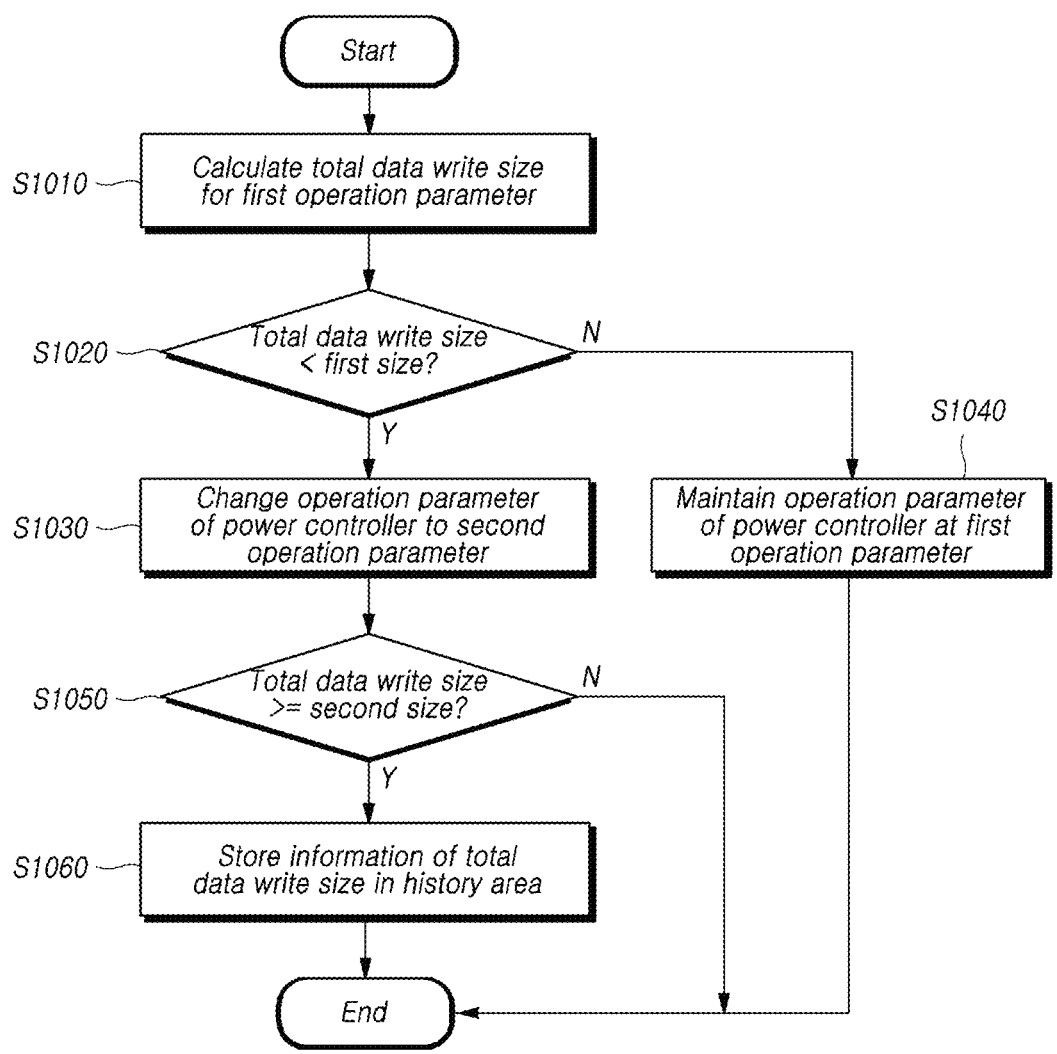
FIG. 10 is a flow chart illustrating a representation of an example of an operation of a memory system in accordance with embodiments of the disclosed technology.

FIG. 10 is a flow chart illustrating a representation of an example of an operation of the memory system 100 in accordance with the embodiments of the disclosed technology.

Hereinafter, it will be described by way of example that the present operation is executed by the memory controller 120 included in the memory system 100. It is assumed that the first operation parameter among candidate operation parameters is currently set as the current operation parameter of the power controller PWR_CTRL.

The memory controller 120 may calculate a total data write size for the first operation parameter (S1010).

The memory controller 120 determines whether the total data write size for the first operation parameter, calculated at the step S1010, is smaller than a first size that was set in advance (S1020).

If the total data write size for the first operation parameter is smaller than the first size, the process proceeds to the step S1030 in which the memory controller 120 may change the operation parameter of the power controller PWR_CTRL to a second operation parameter different from the first operation parameter. Each of the first operation parameter and the second operation parameter is one of the plurality of candidate operation parameters that is set in advance.

On the other hand, if the total data write size for the first operation parameter is equal to or larger than the first size, the process proceeds to the step S1040 in which the memory controller 120 may maintain the current operation parameter of the power controller PWR_CTRL, which is the first operation parameter.

After the step S1030, the memory controller 120 may determine whether to store the total data write size for the first operation parameter, in a history area that was set in advance.

The history area corresponds to an area which stores history information on operation parameters and may be positioned in the working memory 125 inside the memory controller 120.

The history information on an operation parameter may include a total data write size for the operation parameter. For example, history information on operation parameters may indicate that a total data write size is 60 GB when the operation parameter of the power controller PWR_CTRL is the first operation parameter and a total data write size is 30 GB when the operation parameter of the power controller PWR_CTRL is the second operation parameter.

The memory controller 120 determines whether the total data write size for the first operation parameter is equal to or larger than a second size set in advance (S1050). The second size is smaller than the first size. For example, when the first size is 30 GB, the second size is 10 GB.

If the total data write size for the first operation parameter is equal to or larger than the second size, the process proceeds to the step S1060 in which the memory controller 120 may store information on the total data write size for the first operation parameter in the history area.

On the other hand, if the total data write size for the first operation parameter is smaller than the second size, the process proceeds to the step S1050 in which the memory controller 120 does not store information on the total data write size for the first operation parameter in the history area.

As described above, when the operation parameter of the power controller PWR_CTRL is changed from the first operation parameter to the second operation parameter, the history information on the first operation parameter is stored as a previous operation parameter in the history area in the memory controller 120.

In some implementations, the memory controller 120 may select the operation parameter of the power controller PWR_CTRL among only some of the candidate operation parameters that allow to guarantee at least certain level of the stability, the certain level above a specific reference level.

If a total data write size for a specific operation parameter is smaller than the second size, the memory controller 120 may determine that the corresponding operation parameter does not guarantee the certain level of the stability. Therefore, the memory controller 120 does not store history information on the corresponding operation parameter in the history area such that the corresponding operation parameter is not selected as the operation parameter of the power controller PWR_CTRL.

Figure 11:
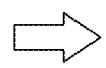
FIG. 11 is a diagram illustrating a representation of an example of an operation of selecting an operation parameter of a power controller in a memory system in accordance with embodiments of the disclosed technology.

FIG. 11 is a diagram illustrating a representation of an example of an operation of selecting the operation parameter of the power controller PWR_CTRL in the memory system 100 in accordance with the embodiments of the disclosed technology.

In FIG. 10, if a total data write size for any operation parameter among the candidate operation parameters set in advance is equal to or larger than the first size, the memory controller 120 may maintain the operation parameter of the power controller PWR_CTRL as the corresponding operation parameter.

The diagrams shown in FIG. 11 show that total data write sizes for all the candidate operation parameters are smaller than the first size that is greater than 3 GB. In this case, an error is always likely to occur in a process of driving a firmware by the memory controller 120, if an operation parameter is selected among the candidate operation parameters.

In this case, the memory controller 120 may select an operation parameter among the candidate operation parameters such that the operation parameter can minimize the possibility of an error to occur in the process of driving the firmware.

With reference to FIG. 11, an operation of setting the operation parameter of the power controller PWR_CTRL when total data write sizes for all candidate operation parameters are smaller than the first size will be described.

In FIG. 11, it is assumed that there are five candidate operation parameters including a first operation parameter PARAM_1, a second operation parameter PARAM_2, a third operation parameter PARAM_3, a fourth operation parameter PARAM_4, and a fifth operation parameter PARAM_5.

It is assumed that, in the history area, there are stored a value of 500 MB as a total data write size for the first operation parameter PARAM_1, a value of 1 GB as a total data write size for the second operation parameter PARAM_2, a value of 2 GB as a total data write size for the third operation parameter PARAM_3, a value of 3 GB as a total data write size for the fourth operation parameter PARAM_4 and a value of 1 GB as a total data write size for the fifth operation parameter PARAM_5.

The memory controller 120 may set the operation parameter of the power controller PWR_CTRL to the fourth operation parameter PARAM_4 whose total data write size is maximum among the five candidate operation parameters.

This is because the corresponding operation parameter, i.e., the fourth operation parameter, allows the memory controller 120 to write the largest amount of data without an error as compared to first, second, third, and fifth operation parameters. At the step S1020 of FIG. 10, the total data write size for the fourth operation parameter has the smallest difference from the first size as compared to those for first, second, third, and fifth operation parameters.

Figure 12:
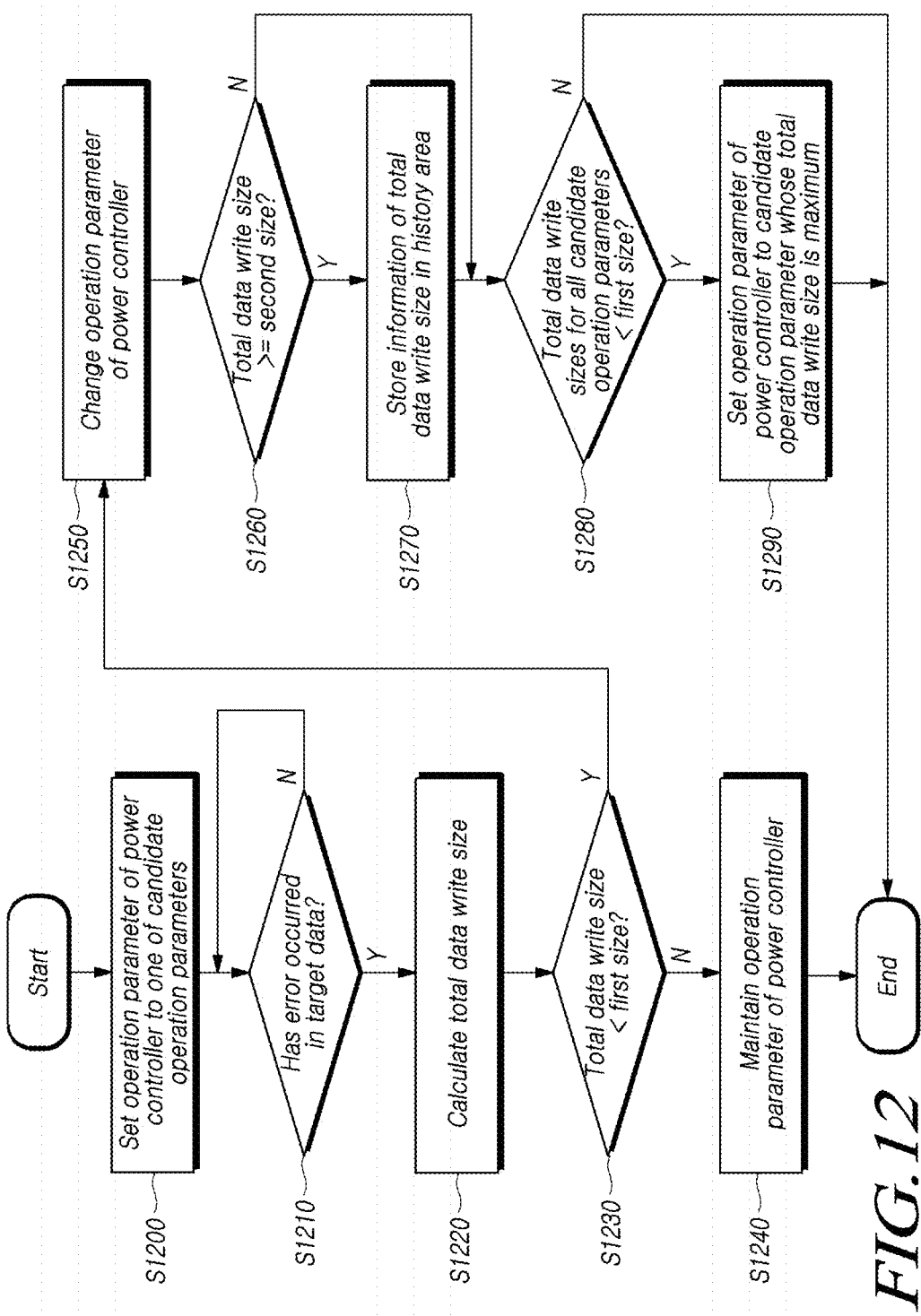
FIG. 12 is a flow chart illustrating a representation of an example of an operation of a memory system in accordance with embodiments of the disclosed technology.

FIG. 12 is a flow chart illustrating a representation of an example of an operation of the memory system 100 in accordance with the embodiments of the disclosed technology.

Hereinafter, it will be described by way of example that the present operation is executed by the memory controller 120 included in the memory system 100.

First, the memory controller 120 may set the operation parameter of the power controller PWR_CTRL to one of a plurality of candidate operation parameters that are set in advance (S1200).

After the step S1200, the memory controller 120 determines whether an error has occurred in target data stored in a target memory area that is set in advance (S1210).

In the case where no error has occurred in the target data, the memory controller 120 may repeat the step S1210 after a certain period of time.

In the case where an error has occurred in the target data, the process proceeds to the step S1220 in which the memory controller 120 may calculate a total data write size for a currently set operation parameter of the power controller PWR_CTRL (S1220). The total data write size for the operation parameter of the power controller PWR_CTRL may be calculated as in the method described above with reference to FIG. 9.

The memory controller 120 determines whether the total data write size for the currently set operation parameter of the power controller PWR_CTRL is smaller than a first size set in advance (S1230).

If the total data write size is equal to or larger than the first size, the process proceeds to the step S1240 in which the memory controller 120 may maintain the operation parameter of the power controller PWR_CTRL without making any changes on the operation parameter of the power controller PWR_CTRL.

On the other hand, if the total data write size is smaller than the first size, the process proceeds to the step S1250 in which the memory controller 120 may change the operation parameter of the power controller PWR_CTRL to an operation parameter value different from the current operation parameter.

After the memory controller 120 changes the operation parameter of the power controller PWR_CTRL at the step S1250, the memory controller 120 determines whether the total data write size for the operation parameter of the power controller PWR_CTRL before the change is equal or larger than a second size set in advance (S1260).

If the total data write size for the operation parameter of the power controller PWR_CTRL before the change is equal to or larger than the second size, the process proceeds to the step S1270 in which the memory controller 120 may store information on the total data write size for the operation parameter of the power controller PWR_CTRL before the change in a history area (S1270).

Thereafter, the memory controller 120 determines whether total data write sizes for all candidate operation parameters are smaller than the first size (S1280).

If the total data write sizes for all the candidate operation parameters are smaller than the first size, the process proceeds to the step S1290 in which the memory controller 120 may set the operation parameter of the power controller PWR_CTRL to a candidate operation parameter whose total data write size is maximum among the candidate operation parameters.

Figure 13:
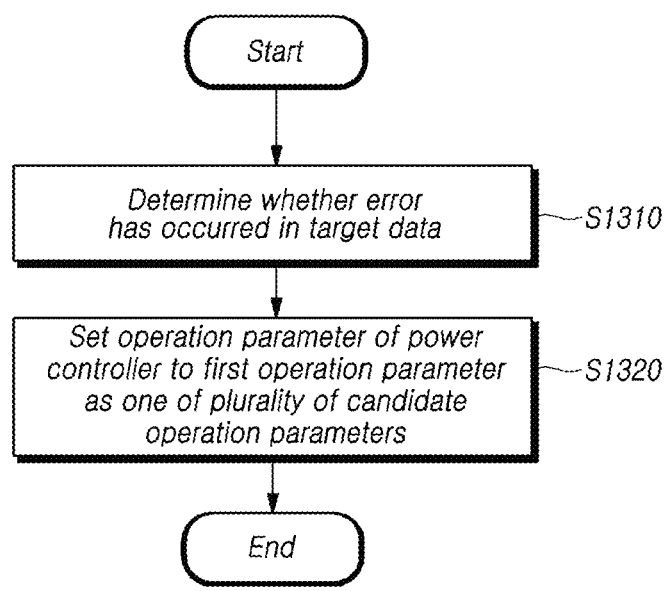
FIG. 13 is a flow chart illustrating a representation of an example of a method for operating a memory controller in accordance with embodiments of the disclosed technology.

FIG. 13 is a flow chart illustrating a representation of an example of a method for operating the memory controller 120 in accordance with the embodiments of the disclosed technology.

The method for operating the memory controller 120 may include step S1310 of determining whether an error has occurred in target data stored in a target memory area set in advance (S1310).

Further, the method for operating the memory controller 120 may include step S1320 of setting, when an error has occurred in the target data, the operation parameter of the power controller PWR_CTRL which controls the magnitude of the power supplied to the memory controller 120, to a first operation parameter as one of a plurality of candidate operation parameters set in advance.

Meanwhile, the above-described operation of the memory controller 120 may be controlled by the control circuit 123, and may be performed in such a manner that the processor 124 executes (drives) firmware to which general operations of the memory controller 120 are programmed.

Figure 14:
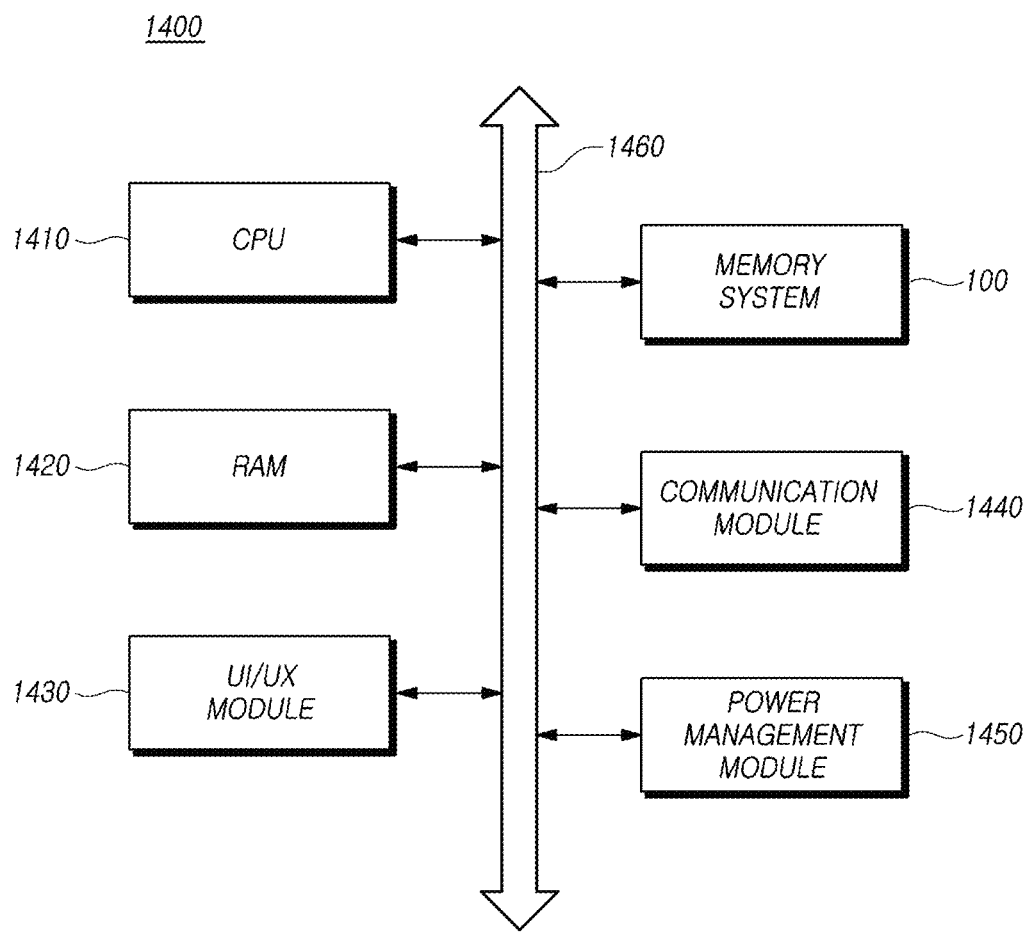
FIG. 14 is a configuration diagram illustrating a representation of an example of a computing system in accordance with embodiments of the disclosed technology.

FIG. 14 is a configuration diagram illustrating a representation of an example of a computing system 1400 in accordance with the embodiments of the disclosed technology.

Referring to FIG. 14, the computing system 1400 in accordance with the embodiments of the disclosed technology may include a memory system 100, a central processing unit (CPU) 1410 for controlling general operations of the computing system 1400, a RAM 1420 for storing data and information related with operations of the computing system 1400, a UI/UX (user interface/user experience) module 1430 for providing use environment to a user, a communication module 1440 for communicating with an external device in a wired and/or wireless manner and a power management module 1450 for managing power used by the computing system 1400, which are electrically coupled to a system bus 1460.

The computing system 1400 may include a PC (personal computer), a mobile terminal such as a smartphone and a tablet or various electronic devices.

The computing system 1400 may further include a battery for supplying an operating voltage, and may further include an application chipset, a graphic-related module, a camera image processor (CIS), a DRAM and so forth. Besides, it is obvious to those skilled in the art that the computing system 1400 may include other components.

The memory system 100 may include not only a device which stores data in a magnetic disk, such as a hard disk drive (HDD), but also a device which stores data in a nonvolatile memory, such as a solid state drive (SDD), a universal flash storage (UFS) device and an embedded MMC (eMMC) device. The nonvolatile memory may include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and an FRAM (ferroelectric RAM). In addition, the memory system 100 may be realized into various types of storage devices, and may be mounted in various electronic devices.

Although exemplary embodiments of the disclosed technology have been described for illustrative purposes, those skilled in the art will appreciate that various modifications, additions and substitutions are possible.

What is claimed is:

1. A memory system comprising:
a memory device; and
a memory controller in communication with the memory device and configured to control the memory device and to control a magnitude of power supplied to the memory controller,
wherein the memory controller is configured to:
determine whether an error has occurred in target data stored in a predetermined target memory area of the memory device, and
determine, in response to whether an error has occurred in the target data, the magnitude of the supplied power based on a first operation parameter selected among predetermined candidate operation parameters in connection with the magnitude of the supplied power.

2. The memory system according to claim 1, wherein the memory controller comprises a low drop-out regulator for controlling the supplied power.

3. The memory system according to claim 1, wherein the memory controller is configured to determine that the error has occurred in the target data based on a checksum for the target data.

4. The memory system according to claim 1,
wherein the memory controller is further configured to determine whether to maintain or change the first operation parameter in controlling the supplied power based on a total data write size for the first operation parameter, and the total data write size for the operation parameter is determined as a total data size required to write data to the memory device based on a request from a host during a certain period of time.

5. The memory system according to claim 4, wherein the certain period of time starts when the memory controller set the first operation parameter and ends at a time of occurrence of the error in the target data or a confirmation of the error by the memory controller.

6. The memory system according to claim 4, wherein the memory controller is configured to change the first operation parameter to a second operation parameter based on a determination that the total data write size for the first operation parameter is smaller than a predetermined first size.

7. The memory system according to claim 6, wherein the memory controller is further configured to determine whether to store the total data write size for the first operation parameter in a history area that is predetermined.

8. The memory system according to claim 7, wherein the memory controller is configured to store information on the total data write size for the first operation parameter in the history area in a case that the total data write size for the first operation parameter is equal to or larger than a predetermined second size.

9. The memory system according to claim 6, wherein the memory controller is further configured to select the second operation parameter as one whose total data write size is maximum as compared to remaining candidate operation parameters when total data write sizes for all the candidate operation parameters are smaller than the first size.

10. A memory controller for controlling a power controller, comprising:
a control circuit configured to determine a first operation parameter of the power controller that is configured to control a magnitude of power supplied to the memory controller, and
wherein the control circuit is further configured to:
determine whether an error has occurred in target data stored in a predetermined target memory area of the memory device, and
determine, in response to whether an error has occurred in the target data, the magnitude of the supplied power based on a first operation parameter selected among predetermined candidate operation parameters in connection with the magnitude of the supplied power.

11. The memory controller according to claim 10, wherein the power controller comprises a low drop-out regulator for controlling the supplied power.

12. The memory controller according to claim 10, wherein the control circuit is further configured to determine that the error has occurred in the target data based on a checksum for the target data.

13. The memory controller according to claim 10, wherein the control circuit is further configured to determine whether to maintain or change the first operation parameter in controlling the supplied power based on a total data write size for the first operation parameter, and the total data write size for the operation parameter is determined as a total data size required to write data to the memory device based on a request from a host during a certain period of time.

14. The memory controller according to claim 13, wherein the certain period of time starts when the memory controller set the first operation parameter and ends at a time of occurrence of the error in the target data or a confirmation of the error by the control circuit.

15. The memory controller according to claim 13, wherein the control circuit is further configured to change the first operation parameter to a second operation parameter based on a determination that the total data write size for the first operation parameter is smaller than a predetermined first size.

16. The memory controller according to claim 15, wherein the control circuit is further configured to determine whether to store the total data write size for the first operation parameter in a history area that is predetermined.

17. The memory controller according to claim 16, wherein the control circuit is further configured to store information on the total data write size for the first operation parameter in the history area in a case that the total data write size for the first operation parameter is equal to or larger than a predetermined second size.

18. The memory controller according to claim 15, wherein the control circuit is further configured to select the second operation parameter as one whose total data write size is maximum as compared to remaining candidate operation parameters when total data write sizes for all the candidate operation parameters are smaller than the first size.

* * * * *